United States Patent [19]

Heymann et al.

[11] Patent Number: 4,766,017

[45] Date of Patent: Aug. 23, 1988

[54] PROCESS FOR THE ADHESIVE METALLIZATION OF CERAMIC MATERIALS

[75] Inventors: Kurt Heymann; Christoph Donner, both of Berlin, Fed. Rep. of Germany

[73] Assignee: Schering Aktiengesellschaft, Berlin, Fed. Rep. of Germany

[21] Appl. No.: 882,637

[22] Filed: Jul. 7, 1986

Related U.S. Application Data

[63] Continuation of Ser. No. 677,293, Dec. 3, 1984, abandoned, which is a continuation of Ser. No. 447,623, Dec. 6, 1982, abandoned.

[30] Foreign Application Priority Data

Dec. 15, 1981 [DE] Fed. Rep. of Germany ....... 3150399

[51] Int. Cl.$^4$ .......................... B05D 3/02; B05D 3/10
[52] U.S. Cl. .................................. 427/444; 156/663; 156/667; 427/305; 427/309
[58] Field of Search ................ 156/663, 667; 427/106, 427/305, 309, 444

[56] References Cited

U.S. PATENT DOCUMENTS 3,690,921  9/1972  Elmore .......................... 427/305 X

*Primary Examiner*—Evan K. Lawrence
*Attorney, Agent, or Firm*—Michael J. Striker

[57] ABSTRACT

A process is disclosed for the adhesive metallization of ceramic materials by roughening of the materials and subsequent chemical and, if necessary, galvanic metal deposition, in which the materials are treated with an alkali hydroxide solution having a temperature from 50° to 180° C. for the roughening, and are subsequently heated to a temperature between about 300° and 600° C. The metal coatings provided on the ceramic materials display adhesive strengths from 3 to 5 kg/inch. Such materials find use in the fields of electrical engineering and electronics.

5 Claims, No Drawings

4,766,017

PROCESS FOR THE ADHESIVE METALLIZATION OF CERAMIC MATERIALS

This is a continuation of application Ser. No. 677,293, filed Dec. 3, 1984, which in turn is a continuation of application Ser. No. 447,623, filed Dec. 6, 1982, both now abandoned.

BACKGROUND OF THE INVENTION

This invention concerns a process for the adhesive metallization of ceramic materials by roughening of the materials and subsequent chemical metallization.

It is known that for the purpose of metallization of non-conducting objects, to use processes for chemical metallization. In order to obtain sufficiently greater adhesiveness it is necessary to roughen the surfaces of these objects mechanically or chemically. This is performed with plastics mainly by acid oxidative digestion of the surface.

In the field of electrical engineering, particularly in the electronics sector, ceramic materials such as aluminum oxide, berryllium oxide, ferrite, barium titanate as well as quartz or borosilicate have been employed for a long time. The surface of these objects, to which also enamel can belong, cannot be roughened in conventional manner, since they are not accessible to an oxidative attack.

A known process for the roughening of aluminum oxide ceramics is, for example, the treatment of such objects in melts of alkali hydroxides. By placing the objects in such melts, the surface can be sufficiently dissolved and thereby roughened, so that after appropriate activation through seeding with metal ions, an adhesive chemical metallization is possible.

It is a disadvantage with this process that upon extracting the object from the melt, very much alkali hydroxide gets carried off. The result is that, with the exception of platinum, this aggressive melt strongly attacks all known crucible materials. Moreover, during operation the melt becomes more and more enriched with the aluminum dissolved off from the surface of the ceramic material which leads to an increase in the melting point and therewith to necessarily higher energy supply.

SUMMARY OF THE INVENTION

It is therefore an object of the present invention to make available a process which in energy-saving manner, while avoiding unnecessary carrying off losses, makes possible an adhesive metallization of ceramic materials.

This object is attained according to the present invention by a process of the above-described type, which is thereby characterized in that the materials are treated with an alkali hydroxide solution and subsequently heated.

Particular embodiments of this process include
(a) that the alkali hydroxide solution display a temperature of about 50° to 180° C., preferably from 80° to 1200° C.;
(b) that a saturated aqueous alkali hydroxide solution be used;
(c) that the materials are dried after the treatment with the alkali hydroxide solution; and
(d) that the materials, after the alkali hydroxide treatment, are heated to about 300° to 600° C., preferably to 5000° C.

The process according to the present invention has, compared to the known processes, the advantage of making possible the roughening operation but avoiding the technically very expensive alkali hydroxide melt.

A further advantage is that the amount of alkali hydroxide applied according to the invention practically corresponds to the amount which is consumed upon the subsequent heating through chemical dissolution of the surface, whereby a further disadvantageous surface attack is excluded. Connected herewith is a savings not only of alkali hydroxide but also of rinsing water, since on account of the very small amounts of alkali hydroxide possibly yet adhering after the treatment, the rinsing operation can be done more simply. The process according to the present invention is therefore technically particularly advanced, and leads in surprising manner to the obtaining of metal layers on ceramic materials, which display a great adhesive strength of about 3 to 5 kg per inch.

The process according to the present invention is suitable in outstanding manner for the metallization of ceramic materials based upon aluminum oxide, beryllium oxide, ferrites, barium titanates, quartz, silicates and others.

As alkali hydroxide solutions, aqueous solutions of sodium- and potassium-hydroxide can be used, which should preferably display a saturation concentration.

The performance of the process according to the present invention follows by immersing, rinsing or wetting of the materials to be metallized with the solutions to be employed according to the present invention. The treatment period depends upon the concentration of the solutions and the surface roughness of the materials, and amounts generally to between about 10 seconds and 2 minutes.

The subsequent drying of the parts is applied only briefly, for example by allowing them to stand at room temperature, light heating or blowing, whereby subsequently in an appropriate oven, expediently a so-called tunnel oven, they are then heated. The temperatures should herewith amount to between about 300° and 600° C., preferably 500° C., the reaction period being selected indeed according to the degree of heating, and amounting to between about 2 and 30 minutes.

The rinsing of the treated parts for removal of the then still adhering alkalis can, on account of their small amounts, follow with known processes using only small amounts of rinse water.

The activation and chemical metallization of the parts treated according to the present invention is performed according to known processes using activation agent and baths customary for this purpose.

The ceramic materials metallized according to the present invention find use in electrical engineering and electronics.

The novel features which are considered characteristic for the invention are set forth in particular in the appended claims. The invention itself, however, both as to its construction and its method of operation, together with additional objects and advantages thereof, will be best understood from the following description of specific embodiments.

DESCRIPTION OF THE PREFERRED EMBODIMENTS

EXAMPLE

A carrier body of aluminum oxide ceramic in the shape of a thin platelet with smooth surface is immersed for 1 minute in an aqueous potassium hydroxide solution, which contains 178 g potassium hydroxide in 100 g water, and displays a temperature of 100° C.

After brief drying in an air stream at room temperature, the carrier body is heated in a tunnel oven for 20 minutes to 500° C., whereby a reaction of the alkalis adhering on the ceramic surface, with the aluminum oxide, is caused, which leads to its elimination. Subsequently, the carrier body is freed of possibly still adhering alkali residue by rinsing with water, and it is then ready for the subsequent metallization.

For this purpose the body is activated by means of an activator solution based upon palladium and then metallized using a chemical copper bath.

The deposited metal coating displays an adhesive strength of 5 kg per inch in the peeling test.

The metal coating can, in case desired, be galvanically reinforced using a customary copper or nickel bath.

It will be understood that each of the elements described above, or two or more together, may also find a useful application in other types of surface treatments differing from the types described above.

While the invention has been illustrated and described as embodied in a process for the adhesive metallization of ceramic materials, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

We claim:

1. In a process for the adhesive metallization of ceramic material by roughening of the material and subsequent chemical metal deposition, with or without galvanic metal deposition, the improvement wherein said roughening comprises treating said material with an alkali hydroxide solution having a temperature from 50° to 180° C. and subsequently heating said material to a temperature between about 300° and 600° C.

2. Process according to claim 1, wherein said alkali hydroxide solution displays a temperature from 80° to 120° C.

3. Process according to claim 1, wherein said alkali hydroxide solution is a saturated aqueous alkali hydroxide solution.

4. Process according to claim 1, wherein after the treating with the alkali hydroxide solution the material is then dried.

5. Process according to claim 1, wherein after the alkali hydroxide treatment the material is heated to about 500° C.

* * * * *